US010355001B2

(12) United States Patent
Williams et al.

(10) Patent No.: US 10,355,001 B2
(45) Date of Patent: Jul. 16, 2019

(54) MEMORIES AND METHODS TO PROVIDE CONFIGURATION INFORMATION TO CONTROLLERS

(71) Applicant: MICRON TECHNOLOGY, INC., Boise, ID (US)

(72) Inventors: Brett L. Williams, Boise, ID (US); Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/193,506

(22) Filed: Nov. 16, 2018

(65) Prior Publication Data

US 2019/0088651 A1 Mar. 21, 2019

Related U.S. Application Data

(63) Continuation of application No. 13/397,392, filed on Feb. 15, 2012, now Pat. No. 10,141,314.

(51) Int. Cl.
*H01L 27/105* (2006.01)
*H01L 25/065* (2006.01)
*G11C 5/06* (2006.01)
*G11C 5/04* (2006.01)

(52) U.S. Cl.
CPC .............. *H01L 27/105* (2013.01); *G11C 5/04* (2013.01); *G11C 5/063* (2013.01); *H01L 25/0657* (2013.01); *H01L 2924/0002* (2013.01)

(58) Field of Classification Search
CPC .............. H01L 27/105; H01L 25/0657; H01L 2924/0002; G11C 5/04
See application file for complete search history.

(56) References Cited

U.S. PATENT DOCUMENTS

| 5,297,148 | A | 3/1994 | Harari et al. |
| 5,418,752 | A | 5/1995 | Harari et al. |
| 5,535,328 | A | 7/1996 | Harari et al. |
| 5,602,987 | A | 2/1997 | Harari et al. |
| 5,912,848 | A | 6/1999 | Bothwell |
| 5,943,254 | A | 8/1999 | Bakeman, Jr. et al. |
| 6,051,887 | A | 4/2000 | Hubbard |
| 6,092,160 | A | 7/2000 | Marsters |
| 6,168,973 | B1 | 1/2001 | Hubbard |

(Continued)

OTHER PUBLICATIONS

Gian Luca Loi et al, "A Thermally-Aware Performance Analysis of Vertically Integrated (3-D) Processor-Memory Heirarchy", Jul. 2006, pp. 1-6, http://citeseerx.ist.psu.edu/viewdoc/download?doi=10.1.1.88.9543&rep=rep1&type=pdf (Year: 2006).*

(Continued)

*Primary Examiner* — Christopher D Birkhimer
(74) *Attorney, Agent, or Firm* — Dorsey & Whitney LLP

(57) ABSTRACT

A memory system includes a memory controller and a memory module coupled to the memory controller. One such memory module may include a memory package of a first type and a signal presence detect unit configured to provide configuration data associated with a memory package of a second type to the memory controller. The configuration data may be used to configure the memory controller to interface with the memory package of a first type.

20 Claims, 6 Drawing Sheets

(56) References Cited

U.S. PATENT DOCUMENTS

| | | | |
|---|---|---|---|
| 7,181,584 B2* | 2/2007 | LaBerge | G06F 12/0653 711/167 |
| 7,224,595 B2 | 5/2007 | Dreps et al. | |
| 7,260,009 B2* | 8/2007 | Origasa | G11C 11/406 365/189.07 |
| 7,307,863 B2 | 12/2007 | Yen et al. | |
| 7,411,292 B2 | 8/2008 | Chen et al. | |
| 7,411,293 B2 | 8/2008 | Chen et al. | |
| 7,546,435 B2* | 6/2009 | LaBerge | G06F 12/0653 711/154 |
| 7,554,353 B2* | 6/2009 | Lee | H04L 25/0278 326/30 |
| 7,562,271 B2 | 7/2009 | Shaeffer et al. | |
| 7,659,610 B2 | 2/2010 | Chen et al. | |
| 7,685,364 B2* | 3/2010 | Shaeffer | G11C 5/025 711/115 |
| 7,687,921 B2 | 3/2010 | Hiew et al. | |
| 7,804,735 B2* | 9/2010 | Mao | G06F 13/1684 365/233.13 |
| 7,838,337 B2 | 11/2010 | Marimuthu et al. | |
| 7,870,459 B2 | 1/2011 | Hazelzet | |
| 7,990,171 B2* | 8/2011 | Chung | H01L 22/22 324/762.01 |
| 8,000,105 B2 | 8/2011 | Hinkle | |
| 8,055,833 B2* | 11/2011 | Danilak | G06F 13/385 711/103 |
| 8,064,276 B2 | 11/2011 | Norman | |
| 8,209,479 B2* | 6/2012 | Rajan | G06F 1/3203 711/105 |
| 8,370,566 B2* | 2/2013 | Danilak | G06F 13/385 711/103 |
| 8,566,516 B2* | 10/2013 | Schakel | G06F 13/1636 711/106 |
| 8,751,732 B2* | 6/2014 | Danilak | G06F 13/385 711/103 |
| 2001/0002475 A1 | 5/2001 | Bothwell et al. | |
| 2006/0171200 A1 | 8/2006 | Rinerson et al. | |
| 2007/0069374 A1 | 3/2007 | Chen et al. | |
| 2007/0069390 A1 | 3/2007 | Chen et al. | |
| 2007/0143553 A1* | 6/2007 | LaBerge | G06F 12/0653 711/154 |
| 2007/0183251 A1* | 8/2007 | Jang | G11C 5/14 365/233.1 |
| 2007/0258278 A1 | 11/2007 | Bacha et al. | |
| 2008/0030221 A1* | 2/2008 | Lee | H04L 25/0278 326/30 |
| 2008/0080261 A1 | 4/2008 | Shaeffer et al. | |
| 2008/0109775 A1 | 5/2008 | Norman | |
| 2008/0126692 A1 | 5/2008 | Rajan et al. | |
| 2008/0150111 A1 | 6/2008 | Hiller et al. | |
| 2008/0277782 A1 | 11/2008 | Chen et al. | |
| 2009/0024789 A1* | 1/2009 | Rajan | G06F 1/3203 711/105 |
| 2009/0024790 A1* | 1/2009 | Rajan | G11C 7/10 711/105 |
| 2009/0103855 A1 | 4/2009 | Binkert et al. | |
| 2009/0154212 A1* | 6/2009 | Park | G11C 5/04 365/51 |
| 2009/0158918 A1 | 6/2009 | Norman | |
| 2009/0164204 A1 | 6/2009 | Norman | |
| 2009/0166887 A1 | 7/2009 | Upadhyayula et al. | |
| 2009/0171650 A1 | 7/2009 | Norman | |
| 2009/0198924 A1 | 8/2009 | Shaeffer et al. | |
| 2009/0219779 A1* | 9/2009 | Mao | G06F 13/1684 365/233.11 |
| 2009/0273096 A1 | 11/2009 | Hiew et al. | |
| 2010/0001397 A1 | 1/2010 | Kirisawa | |
| 2010/0008034 A1 | 1/2010 | Hinkie | |
| 2010/0020583 A1 | 1/2010 | Kang et al. | |
| 2010/0070696 A1 | 3/2010 | Blankenship | |
| 2010/0074038 A1 | 3/2010 | Ruckerbauer et al. | |
| 2010/0157645 A1 | 6/2010 | Harashima et al. | |
| 2010/0162037 A1 | 6/2010 | Maule et al. | |
| 2010/0214812 A1 | 8/2010 | Kim | |
| 2010/0318730 A1* | 12/2010 | Mao | G06F 13/1684 711/103 |
| 2010/0321973 A1 | 12/2010 | Hofstra | |
| 2011/0002153 A1 | 1/2011 | Gravez et al. | |
| 2011/0010472 A1 | 1/2011 | Kang | |
| 2011/0055616 A1 | 3/2011 | Nishio et al. | |
| 2011/0107009 A1 | 5/2011 | Scouller et al. | |
| 2011/0110168 A1 | 5/2011 | Sung et al. | |
| 2011/0194326 A1* | 8/2011 | Nakanishi | G11C 5/02 365/51 |
| 2011/0242869 A1* | 10/2011 | Lee | H01L 25/0657 365/51 |
| 2011/0260331 A1* | 10/2011 | Lee | H01L 23/544 257/774 |
| 2012/0284480 A1 | 11/2012 | Williams et al. | |

OTHER PUBLICATIONS

Gabriel H. Loh, "3D-Stacked Memory Architectures for Multi-Core Processors", ISCA '08 Proceedings of the 35th Annual International Symposium on Computer Architecture, pp. 453-464, Jun. 2008, https://ieeexplore.ieee.org/stamp/stamp.jsp?tp=&arnumber=4556747 (Year: 2008).*

Anonymous, "Three Dimensional Integration—Considerations for Memory Applications", 2011, pp. 1-7, https://ieeexplore.ieee.org/stamp/stamp.jsp?arnumber=6055356 (Year: 2011).*

Shamik Das et al., "Timing, Energy, and Thermal Performance of Three-Dimensional Integrated Circuits", Apr. 2004, pp. 1-6 Year: 2004).*

Doug Milner, "Three-dimensional SoCs perform for future", Nov. 17, 2003, pp. 1-4, https://www.edn.com/electronics-news/4154602/Three-dimensional-SoCs-perform-for-future?utm_source=eetimes&utm_medium=relatedcontent (Year: 2003).*

LookinAround, "Plug and Play Overview: How Windows Finds Drivers for USB Devices", May 20, 2009, pp. 1-7 https://www.techspot.com/community/topics/plug-and-play-overview-how-windows-finds-drivers-for-usb-devices.127886/.

Microsoft, "How Plug and Play Works", Mar. 28, 2003, pp. 1-10 https://technet.microsoft.com/en-us/library/cc781092(v=ws.1 O).aspx.

Euronymous, "3D Integration: A Revolution in Design", http://www.realworldtech.com/3d-integration/ May 2, 2007, pp. 1-18.

IBM "Understanding DRAM Operation", https://www.ece.cmu.edu/~ece548/localcpy/dramop.pdf Dec. 1996, pp. 1-10.

IBM "Understanding Static RAM Operation", https://www.ece.cmu.edu/~ece548/localcpy/sramop.pdf Mar. 1997, pp. 1-12.

Ickes, Nathan et al., "L7: Memory Basics and Timing", http://web.mit.edu/6.111/www/s2004/LECTURES/I7.pdf Mar. 2004, pp. 1-27.

Milner, Doug "Three-Dimensional SOCs Perform for Future", http://www.eetimes.com/document.asp?doc_id=1217369 Nov. 17, 2003, pp. 1-4.

* cited by examiner

MEMORIES AND METHODS TO PROVIDE CONFIGURATION INFORMATION TO CONTROLLERS

CROSS-REFERENCE TO RELATED APPLICATION

This application is a continuation of U.S. patent application Ser. No. 13/397,392, filed Feb. 15, 2012. This application is incorporated by reference herein in its entirety and for all purposes.

TECHNICAL FIELD

Examples described herein relate to memory devices. Exemplary configurations of memory controllers and memory modules are described.

BACKGROUND

Computer systems may use memory modules, such as dynamic random access memory (DRAM) modules to store data that may be accessed by a processor. These memory modules may be used as system memory in computer systems. Typically, the processor may communicate with the system memory through a processor bus and a memory controller. The memory controller may be integrated into a system controller that may further include bus bridge circuitry for coupling the processor bus to an expansion bus, among other forms of circuitry.

Notably, operation of various memory modules frequently depends on internal and external signal relationships specific to each type of module. As a result, often times memory controllers are configured to interface only with a particular type of memory module, based on the types and number of control signals, signal timings, and signal characteristics associated with that particular type of module.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

As described above, memory controllers may be configured to interface with a particular type of memory module that utilizes particular signal relationships and timing. In some system designs, however, it may be desirable to use another type of memory module without requiring that a system's memory controller be modified or replaced. When a memory controller is configured to interface with a specific memory module, configuring the memory controller to interface with a different type of memory module may require redesigning an entire system controller, or may require manufacturing new memory controllers when existing controllers are already available. This may be undesirable.

Moreover, when designing a new memory module, it may be advantageous to allow the new module to operate with existing systems. However, as a result of using the new memory module, compatibility issues may need to be addressed to ensure operability between the existing memory controller and the memory module.

Embodiments of the present invention may provide systems and methods to configure existing memory controllers to interface with different types of memory modules without requiring that the memory controller be modified or replaced. Moreover, embodiments of the present invention may provide memory modules that are configured to interface with controllers configured to interface with a different type of memory module.

Figure 1:
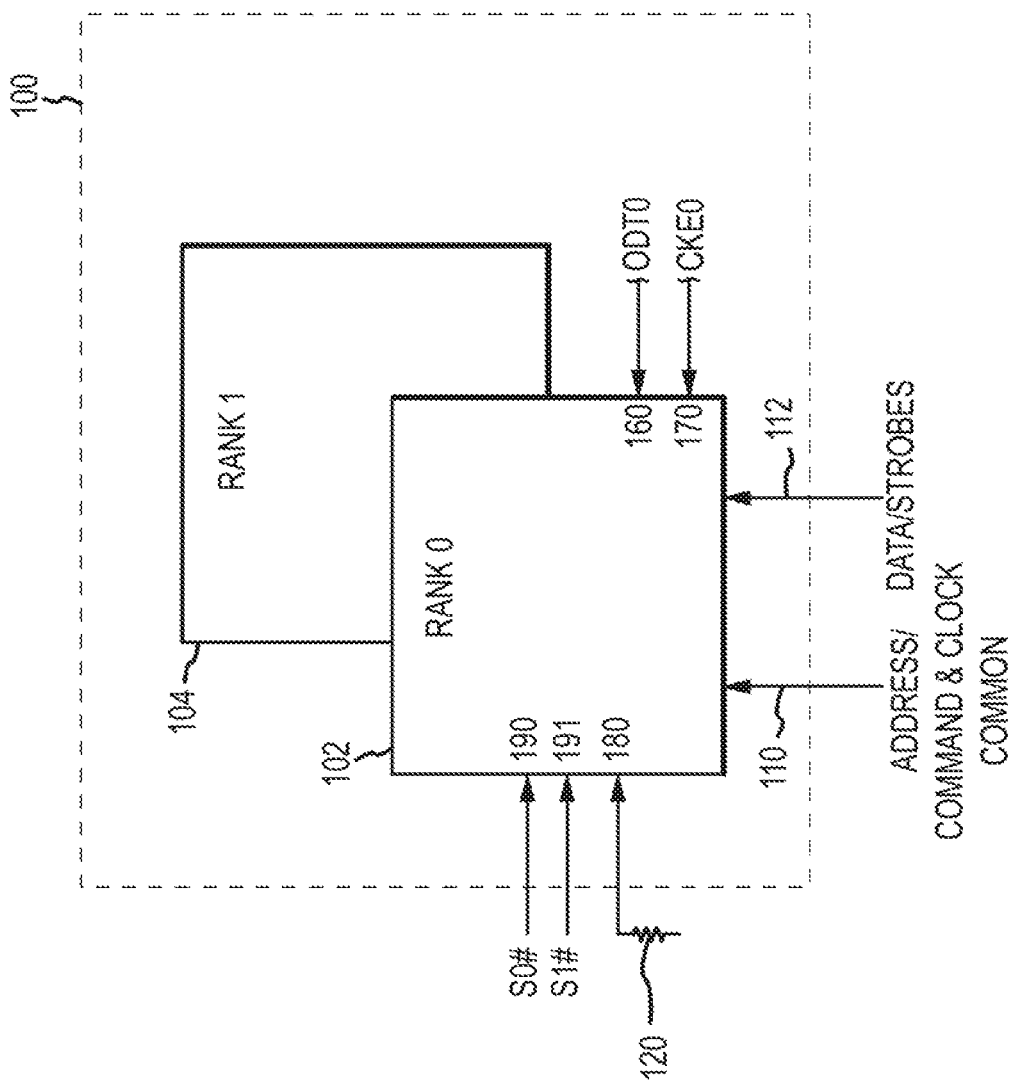
FIG. 1 is a block diagram illustrating a conventional three-dimensional memory package 100.

FIG. 1 is a block diagram illustrating a conventional three-dimensional memory package 100. As shown, the three-dimensional memory package 100 includes two memory die 102 and 104. The memory die 102 and 104 may be configured in a stack and coupled to one another by a plurality of conductive through silicon vias (TSV), wire bonds or other conventional methods. Each of the memory die 102 and 104 may include a plurality of memory cells. Any type of memory may be implemented on the memory die 102 and 104 including, but not limited to, dynamic random access memory (DRAM). The three-dimensional memory package 100 is configured to receive a number of external signals, which may be routed to the memory die 102. Thus, signals provided to the memory die 104 may be coupled to the memory die 104 via a TSV or other connection through the memory die 102. For example, the three-dimensional memory package 100 may receive chip select signals S0# and S1# from a memory controller (not shown in FIG. 1) at inputs 190 and 191, respectively. An active S0# signal may cause the memory die 102 to read control signals from a bus 110, and/or data and strobe signals from a bus 112. An active S1# signal may cause the memory die 104 to read control signals from the bus 110, and/or data and strobe signals from the bus 112. Accordingly, a controller may provide the signal S0# to the three-dimensional memory package 100 to indicate a memory operation for the memory die 102, while the memory controller may provide the signal S1# to the three-dimensional memory package 100 to indicate a memory operation for the memory die 104.

The memory die 102 may be coupled to an impedance 120 and may be further configured to receive an on-die termination signal ODT0 at an input 160. The impedance 120 may be used to calibrate an output driver on the memory die 102 (not shown in FIG. 1). The on-die termination signal ODT0 may be configured to reduce noise and/or signal reflections of signals received by the memory dies 102, 104 by providing a termination impedance. Moreover, the memory die 102 may be configured to receive a clock enable signal CKE0 at an input 170. Both the memory die 102 and the memory die 104 of the three-dimensional memory package 100 may receive the CKE signal from the input 170 and may be configured to activate in response to an active clock enable signal CKE0.

The three-dimensional memory package 100 may be configured to be controlled by an external memory controller (not shown) that interfaces with each memory die of the three-dimensional memory package 100. In addressing each memory die, the memory controller may differentiate each memory die by a rank. For example, as illustrated in FIG. 1, the memory die 102 may be assigned rank 0 and the memory die 104 may be assigned rank 1. Rank 0 may indicate that memory die 102 is the bottom die of the three-dimensional memory package 100, for example, and rank 1 may indicate that memory die 104 is the top die of the three-dimensional memory package 100. Any number of ranks and memory die may be used, and each memory die may he used in any position.

Accordingly, a conventional three-dimensional memory package, such as the package 100 shown in FIG. 1, may be connected to a memory controller. The memory controller may be configured to provide a clock signal to activate the entire memory package (memory dies 102 and 104 in FIG. 1), and two separate chip select signals (S0# and S1# in FIG. 1) to indicate an operation for each of the two individual memory die.

Figure 2:
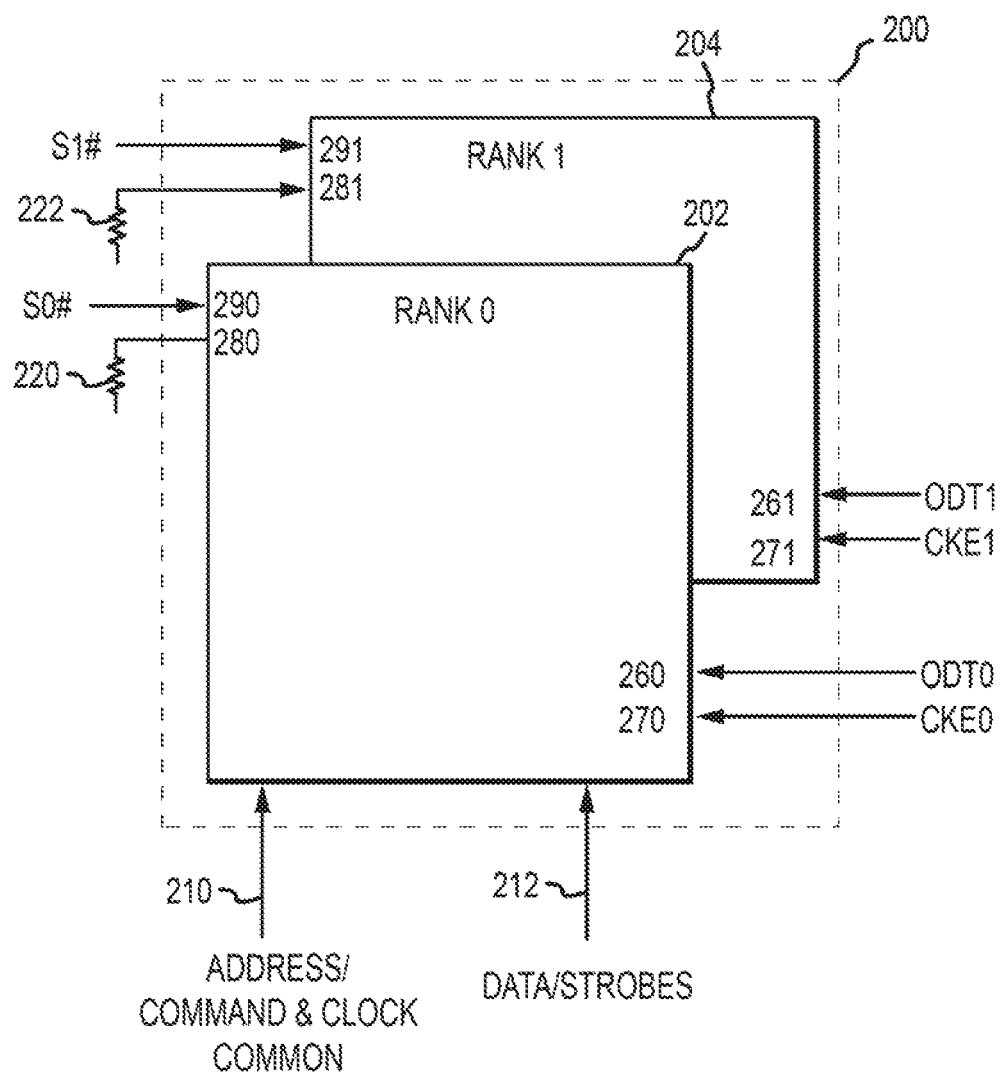
FIG. 2 is a block diagram illustrating a conventional dual die package 200.

A conventional dual die package may employ a different signaling scheme. FIG. 2 is a block diagram illustrating a conventional dual die package 200. The dual die package 200 may include a memory die 202 and a memory die 204. Any number of memory dies may be included, and the memory dies may include any number of memory cells configured to stoic data, and generally any type of memory cell. The dual die package 200 may be configured to receive a number of signals, including address, command, and clock signals on a bus 210, and data and strobe signals on a bus 212. Both the bus 210 and the bus 212 may be coupled to each of the memory die 202, 204, and signals on these busses may be read by the memory die 202, 204 in response to receipt of an active chip select signal S0# or S1# at respective inputs 290 and 291.

The dual die package 200 may be configured to receive chip select signals S0# and S1# at inputs 290 and 291, respectively, and active S0# and S1# signals may cause either memory die 202 or memory die 204, respectively, to perform memory operations, which may include reading from the busses 210, 212. Note that, in contrast to the three-dimensional package 100 described with reference to FIG. 1, in the dual-die package 200 of FIG. 2, each of the memory die 202 and 204 may receive external signals separately.

Impedances 220 and 222 may be coupled to the memory die 202 and 204, respectively, and may be used to calibrate a respective output driver (not shown in FIG. 2). Additionally, memory dies 202, 204 may be further configured to receive respective on-die termination signals ODT0 and ODT1 at inputs 260 and 261, respectively, that may provide dynamic on-die termination impedances which may advantageously mitigate noise and/or signal reflections.

Memory dies 202, 204 may receive individual clock enable signals from a memory controller (not shown in FIG. 2). The memory die 202 may receive the clock enable signal CKE0 at input 270, and the memory die 204 may receive the clock enable signal CKE1 at input 271. Because each memory die 202, 204 receives its own clock enable signal, each memory die 202, 204 may be independently controlled by respective chip select and clock enable signals. As a result, one memory die can be placed in a power down mode, while one operates in a normal mode. This is in contrast to the three-dimensional package of FIG. 1 above, where a single clock enable signal was used to activate a plurality of memory die.

The dual die package 200 may be controlled by an external memory controller (not shown in PEG. 2) that may be in communication with memory dies 202, 204. In addressing each memory die 202, 204, the memory controller may differentiate each memory die by a rank. Memory die 202 may be assigned rank 0 and memory die 204 may be assigned rank 1. Rank 0 may indicate that memory die 202 is at one position in the dual die package, while rank 1 may indicate that memory die 204 is located at another position in the dual die package.

Accordingly, in a conventional dual die package, such as the dual die package 200 of FIG. 2, a controller may provide command and address signals to a shared bus that is coupled to multiple memory die. The controller may independently control individual die in the dual die package by providing a respective chip select signal for each of the die and a respective clock enable signal for each of the die.

Figure 3:
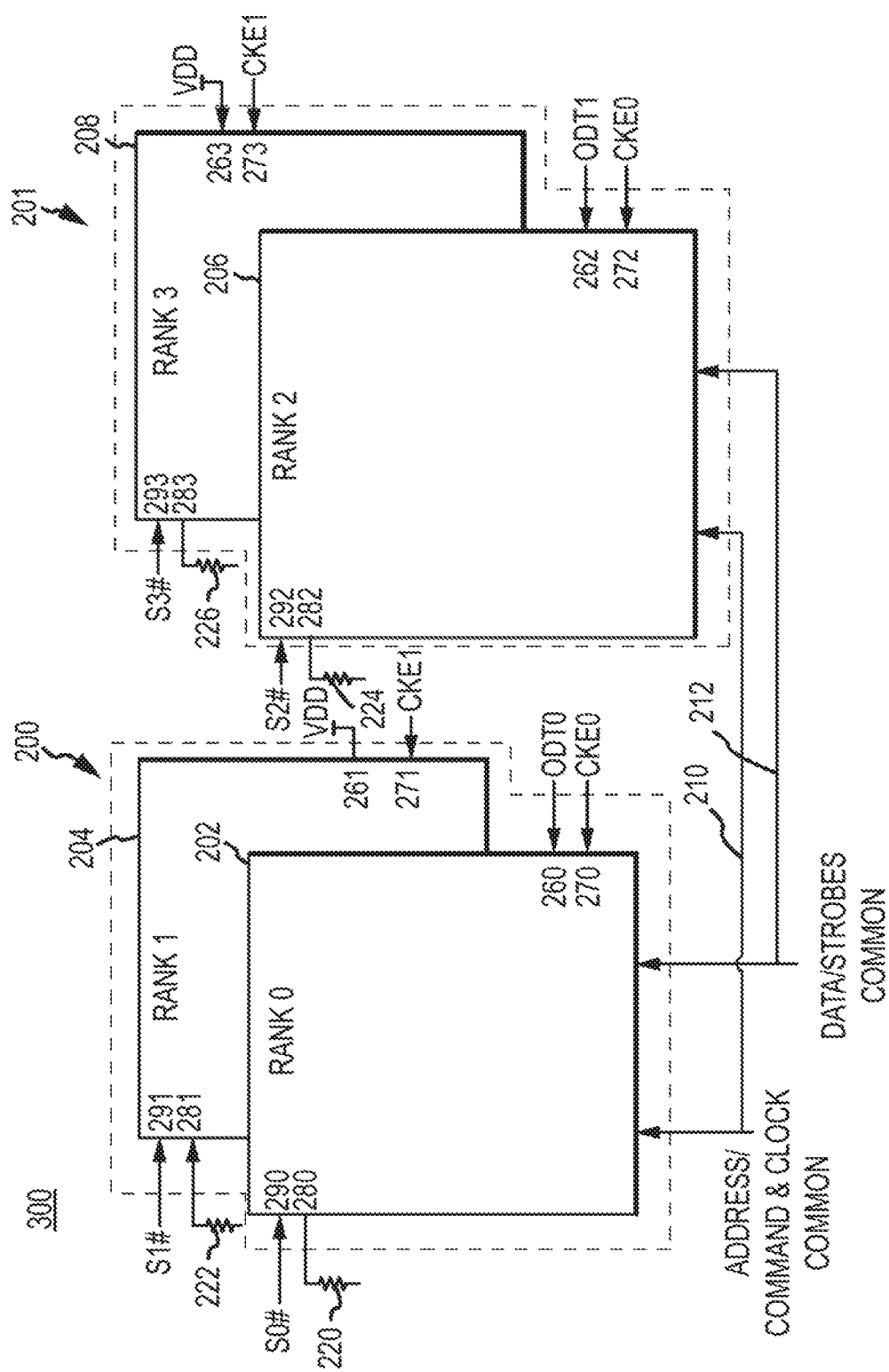
FIG. 3 is a block diagram illustrating a conventional four-rank dual die package 300.

FIG. 3 is a block diagram illustrating a conventional four-rank dual die module 300. The module 300 may be a standard registered dual inline memory module (RDIMM) and may include any number of die packages. In one embodiment, the four-rank dual die module 300 may include the dual die package 200 illustrated in FIG. 2. Because the four-rank dual die module 300 includes elements that have been previously described with respect to the dual die package of FIG. 2, those elements have been shown in FIG. 3 using the same reference numbers used in FIG. 2 and operation of the common elements is as previously described. Consequently, a detailed description of the operation of these elements will not be repeated in the interest of brevity. In contrast to the dual die module 200 of FIG. 2, however, the input 261 of memory die 204 may be coupled to a supply voltage $V_{DD}$. This may enable a mode register (not shown in FIG. 2) in memory die 204, thereby providing a predetermined on-die termination at the memory die 204.

The conventional four-rank dual die module 300 may further include a dual die package 201 including memory die 206 and memory die 208. The dual die package 201 operates in the same manner as dual die module 200, except that dual due package 201 receives chip select signals S2# and S3# at inputs 292 and 293, respectively. Moreover, the memory dies 206, 208 may be assigned ranks 2 and 3, respectively, while, as described above with reference to FIG. 2, memory dies 202, 204 may be assigned ranks 0 and 1. Finally, dual die package 200 may correspond to a row 0 such that rank 0 corresponds to one position at the bottom of row 0 and rank 1 corresponds to another position of row 0, and dual die package 201 may correspond to row 1 such that rank 2 corresponds to one position of row 1 and rank 3 corresponds to another position at the top of row 1.

In operation, a controller (not shown in FIG. 3) may be coupled to each of the dual die packages 200, 201 and may provide each die with individual chip select signals S0#-S3#. Also, because memory dies 202 and 206 assigned to ranks 0 and 2 both receive the CKE0 signal, and memory dies 204 and 208 assigned to ranks 1 and 3 both receive the CKE1 signal, a die in each package may be enabled by providing either an active clock enable signal CKE0 or an active clock enable signal CKE1. Accordingly, to control the module 300, a controller may be configured to provide one clock enable signal (e.g. CKE0) to enable ranks 0 and 2 and may be further configured to provide a second clock enable signal (e.g. CKE1) to enable ranks 1 and 3. The controller may further be configured to provide a respective chip select signal S0#-S3# to each individual memory die.

Figure 4:
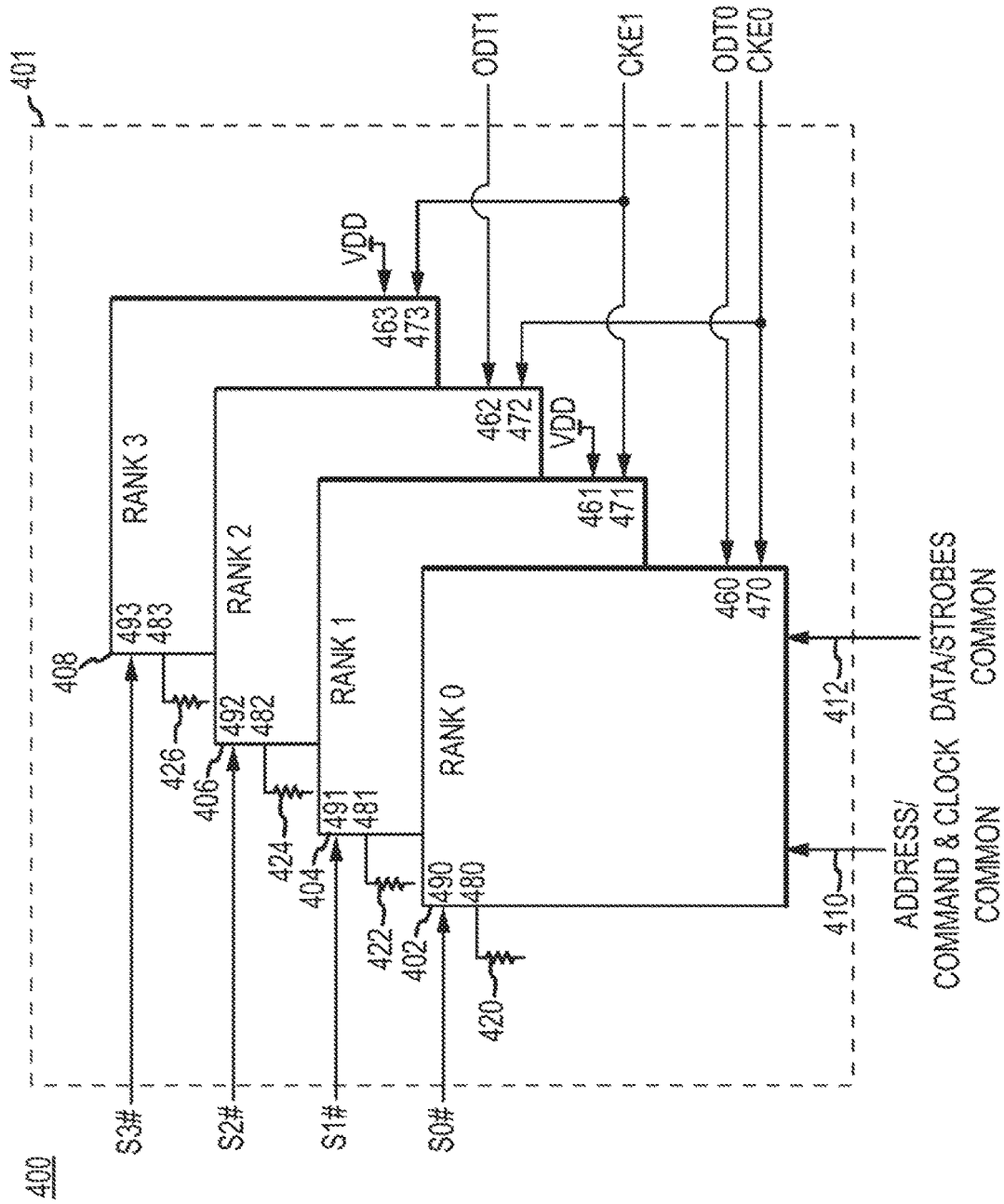
FIG. 4 is a block diagram illustrating a conventional four-rank memory module 400.

FIG. 4 is a block diagram illustrating a conventional four-rank quad die module 400 including a quad die package 401. The module 400 may be a registered dual inline memory module (RDIMM) and may include any number of packages. The quad die package 401 may include memory dies 402, 404, 406, and 408. The quad die package 401 may be configured to receive a number of signals, including address, command and clock signals on a bus 410, and data and strobe signals on a bus 412. Both the bus 410 and the bus 412 may be coupled to the memory die 402 and signals may be further provided to each of the memory dies of quad die package 401 in response to receipt of respective active chip select signals S0#-S3#. The quad die package 401 may be configured to receive chip select signals S0#-S3# at inputs 490-493, respectively.

The memory dies 402-408 may be coupled to respective impedances 420-426 that may be used to calibrate respective output drivers for each memory die 402-408. Memory dies 402 and 406 may be further configured to receive on-die termination signals ODT0 and ODT1 at inputs 460 and 462, respectively, to reduce noise and/or reflections of signals received by the memory dies 402 and 406 by providing a dynamic termination impedance. Memory dies 404 and 408 may have respective inputs 461 and 463 coupled to the supply voltage $V_{DD}$, thereby enabling mode registers (not shown in FIG. 4) in each of the memory dies 404 and 408 to provide a predetermined termination impedance. In other embodiments, each memory die 402-408 may receive an on-die termination signal, or each of the inputs 460-463 may be coupled to the supply voltage $V_{DD}$. It will be appreciated by those having ordinary skill in the art that other implementations may also be used without departing from the scope of the invention.

Moreover, the memory dies 402 and 406 may be configured to receive a clock enable signal CKE0 at respective inputs 470 and 472, and similarly, memory dies 404 and 408 may receive a clock enable signal CKE1 at respective inputs 471 and 473. In at least one embodiment, the clock enable signals CKE0 and CKE1 may be provided by a memory controller (not shown in FIG. 4). Note that, like the clock enable signal CKE0 provided to the three-dimensional package 100 of FIG. 1, clock enable signals CKE0 and CKE1 provided to the quad die package 401 of FIG. 4 may each correspond to a pair of die.

The quad die package 401 may be controlled by an external memory controller (not shown in FIG. 4) that may be in communication with memory dies 402-408. In addressing memory dies 402-408, the controller may differentiate each memory die by a rank. For example, memory die 402 may be assigned rank 0, memory die 404 may be assigned rank 1, memory die 406 may be assigned rank 2, and memory die 408 may be assigned rank 3. Rank 0 may indicate that memory die 402 is at a first position in the quad die package, rank 1 may indicate that memory die 404 is at a second position, rank 2 may indicate that memory die 406 is at a third position, and rank 3 may indicate that memory die 408 is at a fourth position.

Accordingly, in a conventional quad die package, such as the quad die package 401 of FIG. 4, a controller may provide command and address signals to a shared bus that is coupled to multiple memory die. The controller may independently select individual die in the quad die package by providing a respective active chip select signal for each of the die.

Figure 5:
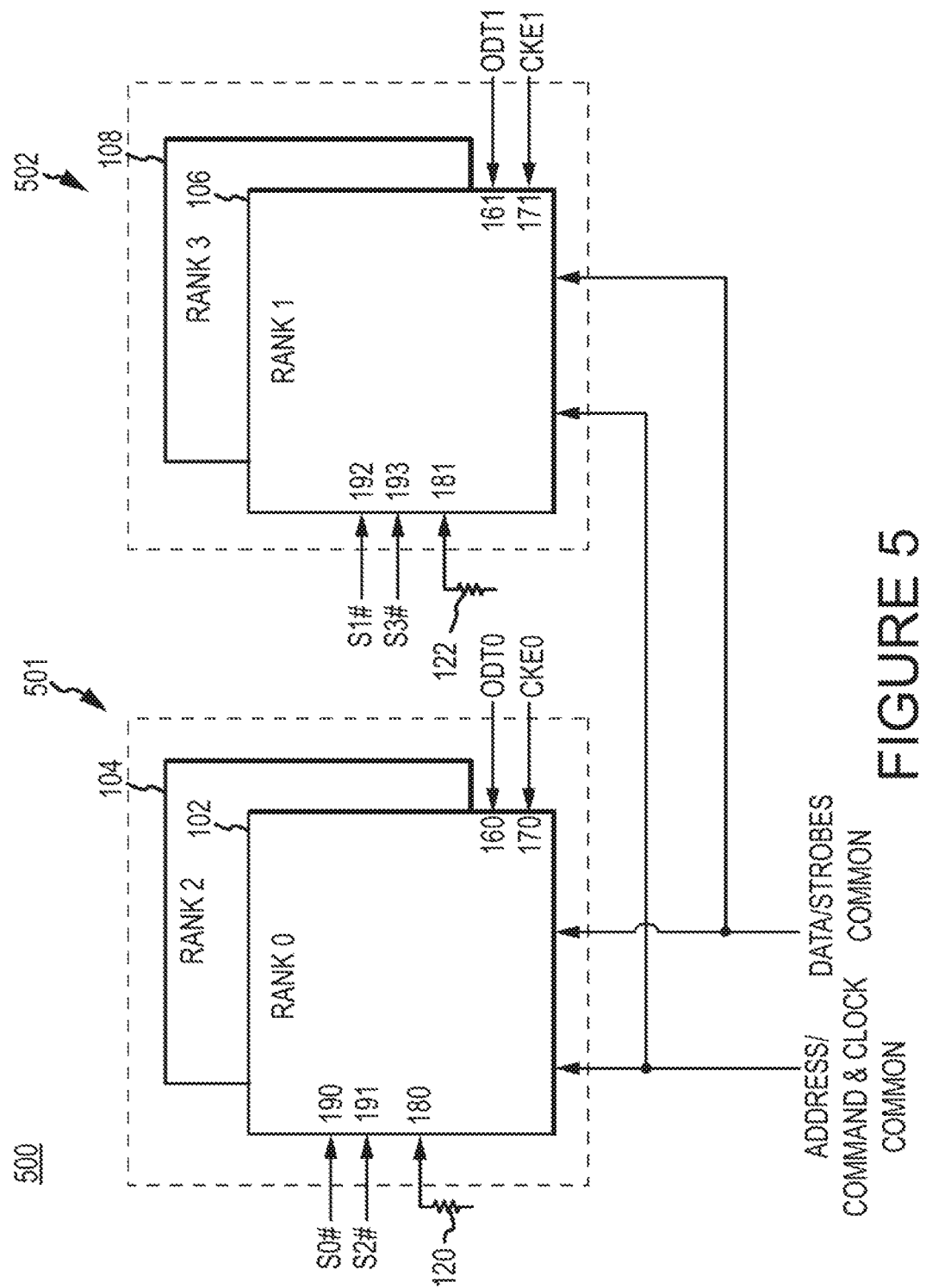
FIG. 5 is a block diagram illustrating a four-rank memory module 500 according to an embodiment of the present invention.

FIG. 5 illustrates a four-rank memory module 500 including three-dimensional memory packages 501 and 502 that, in at least one embodiment, may each be implemented as a three-dimensional memory package, e.g. the three-dimensional memory package 100 illustrated in FIG. 1. Because the four-rank memory module 500 includes elements that have been previously described with respect to the three-dimensional package of FIG. 1, those elements have been shown in FIG. 5 using the same reference numbers used in FIG. 1 and operation of the common elements is as previously described. Consequently, a detailed description of the operation of these elements will not be repeated in the interest of brevity.

The three-dimensional memory package 502 included in the memory module 500 may comprise memory dies 106, 108 and operate in the same manner as the three-dimensional memory package 501, except that the three-dimensional memory package 502 may receive chip select signals S1# and S3# at inputs 192 and 193, respectively. The three-dimensional memory package 502 may also be coupled to an impedance 122 at input 181, that may be used to calibrate the output driver as described above, to reduce to signal reflections and/or noise. The memory dies 106, 108 may be assigned ranks 1 and 3, respectively, while memory dies 102, 104 may be assigned ranks 0 and 2. Consequently, a clock enable signal (e.g. CKE0) provided to the three-dimensional memory package 501 may be provided to ranks 0 and 2. Another clock enable signal (e.g. CKE1) provided to the package 502 may be provided to ranks 1 and 3. The association of CKE0 with ranks 0 and 2 and CKE1 with ranks 1 and 3 is analogous to the association used in a quad die package 401, e.g. the module 401 of FIG. 4.

Referring again to FIG. 5, ranks 0 and 2 may correspond to a row 0, with rank 0 corresponding to a first position and rank 2 corresponding to a second position, and ranks 1 and 3 may correspond to a row 1, with rank 1 corresponding to a first position, and rank 3 corresponding to a second position. It will appreciated by those having skill in the art that variations in the implementations, such as other rank assignments, may be used without departing from the scope of the present invention, and that embodiments are not limited by the description set forth herein.

In this manner, by assigning non-consecutive ranks to dies in each three-dimensional package 501, 502 (e.g. assigning ranks 0 and 2 to dies in three-dimensional memory package 401 and assigning ranks 1 and 3 in three-dimensional memory package 402), the module 500 of FIG. 5 may interface with a controller configured to interface with a four-rank quad die module. In doing so, chip select signals may be provided to each of the three-dimensional memory packages 501, 502 for the appropriate memory dies. The three-dimensional memory package 501 may receive the chip select signals S0# and S2# at inputs 190 and 191, and the three-dimensional memory package 502 may receive the chip select signals S1# and S3# at the inputs 192 and 193. Recall, however, that in the conventional module 400 of FIG. 4, signals S0#-S3# may be provided to a single die package, such as the quad die package 401. Accordingly, the arrangement of chip select signals provided to the three-dimensional memory packages of FIG. 5 may differ from that of the module of FIG. 4.

In some examples, the module 500 of FIG. 5 may be configured to receive the appropriate chip select signals. For example, a conductive trace may connect each of the inputs 190-193 to an external terminal configured to receive the appropriate chip select signal from the memory controller. In this manner, the memory controller need not be modified or replaced. The memory controller may still provide the signals S0#-S3# at the same pins, however, the module 500 may route the signals to the appropriate inputs as indicated in FIG. 5.

Figure 6:
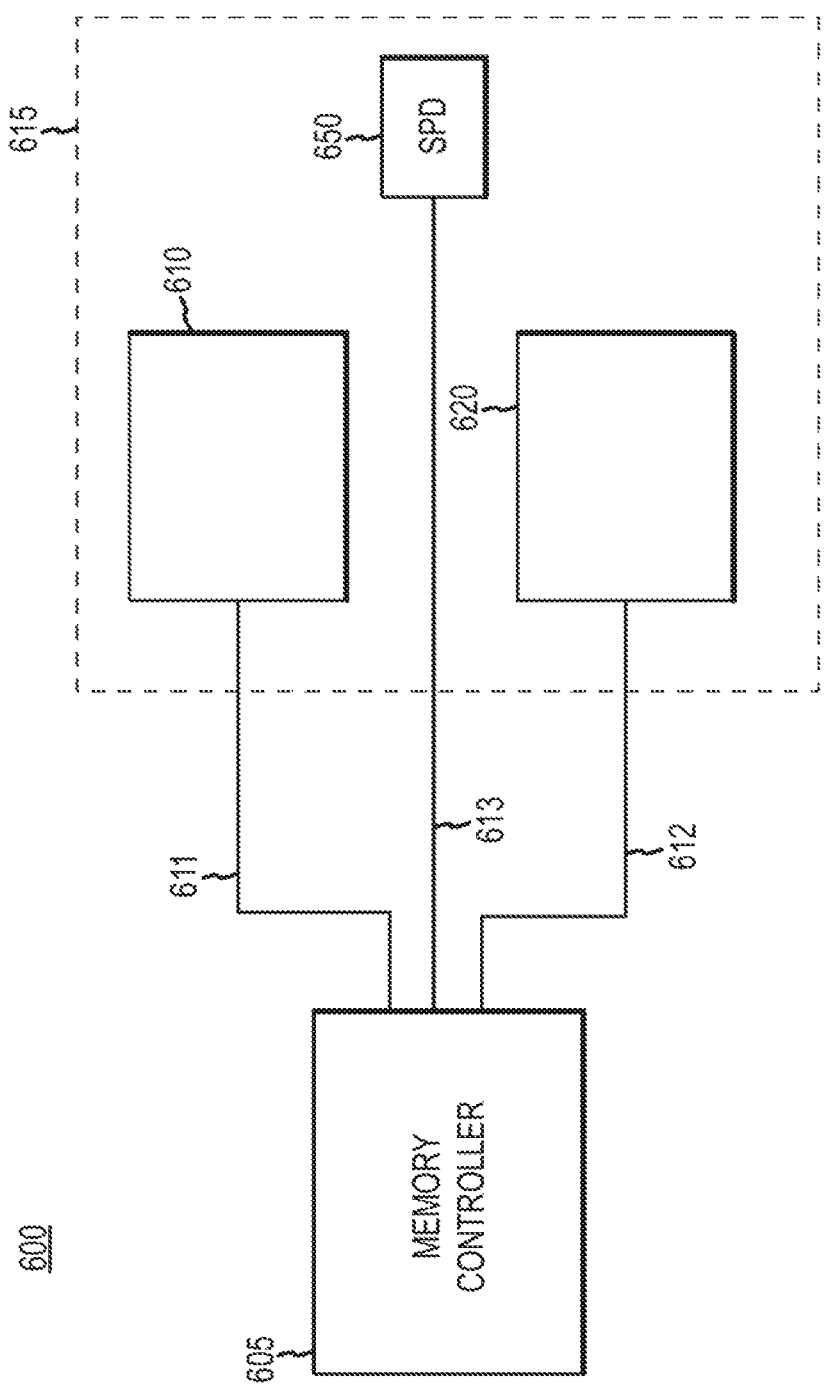
FIG. 6 is a block diagram illustrating a memory system 600 that may include the four-rank memory module 500 of FIG. 5 according to an embodiment of the present invention.

In some embodiments, a memory system, such as the memory system 600 illustrated in FIG. 6, may include a signal presence detect unit. The memory system 600 may include a memory controller 605 and a memory module 615 coupled to the memory controller 605. The memory module 615 may include die packages 610 and 620 as well as a signal presence detect unit 650. Also, in at least one embodiment, memory module 615 may comprise any number of die packages and memory system 500 may comprise any number of memory modules.

The die packages 610 and 620 may be coupled to the memory controller 605 by conductive traces 611 and 612, respectively, and may be three-dimensional memory packages, such as the three-dimensional memory package 100 illustrated in FIG. 1. The signal presence detect unit 650 may be coupled to the memory controller 605 by a conductive trace 613, and in at least one embodiment may be powered independently from the memory module 500. In some embodiments, the signal presence detect unit 650 may be addressed separately from the die packages 610 and 620, and may be a flash memory module or may be an electrically erasable programmable read only memory (EEPROM) module.

In operation, the memory controller 605 may communicate with the signal presence detect unit 650 and receive configuration data stored therein. In one embodiment, the memory controller 605 may be configured to receive configuration data from the signal presence detect unit 650 during an initialization of the memory system 500. In other embodiments, the memory controller 605 may receive the configuration data during each initialization of the memory system 500 or the memory controller 605 may receive configuration data in response to the signal presence detect unit 650 receiving a configuration signal. Moreover, the controller 605 may communicate with the signal presence detect unit 650 through a serial data connection and/or receive data indicative of the temperature of memory module 615. In yet another embodiment, the signal presence detect unit 650 may be configured to store data provided by the controller 605.

The configuration data provided to memory controller 605 from the signal presence detect unit 650 may comprise operating parameters used to configure the memory controller 605 such that the memory controller 605 may interface with the die packages 610 and 620. For example, the configuration data may include control signal timings associated with the die packages 610 and 620, such as timing relationships between clock enable, chip select, and on-die termination signals corresponding to each package. Additionally, the configuration data may also comprise data corresponding to input/output (I/O) pin assignments for the memory controller 605 with respect to control signals, such as chip select and clock enable signals.

As described above, the die packages 610 and 620 of FIG. 6 may comprise three-dimensional memory packages, such as the three-dimensional memory package 100 of FIG. 1. Yet, in one embodiment, the signal presence detect unit 650 may comprise configuration data associated with a package of a different type, such as the quad die package 401 of FIG. 4. Because both the three-dimensional memory package 100 of FIG. 1 and the quad die package 401 of FIG. 4 are configured to receive a chip select signal for each die and a clock enable signal for each pair of die, a four-rank module including a pair of two-die three-dimensional memory packages may interface with a controller configured using the configuration data associated with a four-rank quad die module.

Moreover, because each of a variety of die package types, such as the three-dimensional memory package 100 of FIG. 1 and the quad die package 401 of FIG. 4, may produce unique propagation delays and signal characteristics with respect to control signals, characteristics of traces 611 and 612 may be adjusted to compensate accordingly. In some embodiments, traces used to couple signals between a memory package and the controller 605 may be adjusted to increase or decrease signal propagation delay, thereby providing better alignment of signal timing margins. For example, length and/or conductivity of the traces 611 and 612 may be increased or decreased, and signals provided on traces 611 and 612 may be delayed using logic gates, such inverters or buffers.

As a result of modifying the signal timings stored in memory controller 605 and/or the traces coupling the memory controller 605 to the die packages 610, 620, the memory controller 605 may not have any indication that it is interfacing with a different type of memory module than the type of memory module for which it is configured. In short, modifying traces as well as signal timings may allow one type of memory module to be emulated as a second type of memory module.

From the foregoing it will be appreciated that, although specific embodiments of the invention have been described herein for purposes of illustration, various modifications may be made without deviating from the spirit and the scope of the invention. For example, although the embodiments of the invention are explained in the context of providing configuration data from a signal presence detect unit, it will be understood that configuration data may be provided from other devices as well. Accordingly, the invention is not limited except as by the amended claims.

What is claimed is:
1. A memory module comprising:
a first three-dimensional memory package including at least two stacked memory dies, wherein the first three-dimensional memory package is configured to receive a first clock enable signal and a first plurality of chip select signals;
a second three-dimensional memory package including at least two stacked memory dies, wherein the second three-dimensional memory package is configured to receive a second clock enable signal and a second plurality of chip select signals; and
wherein the at least two stacked dies of the first three-dimensional memory package are assigned respective memory ranks that are different and non-consecutive relative to one another and the at least two stacked dies of the second three-dimensional memory package are assigned respective memory ranks that are different and non-consecutive relative to one another.
2. The memory module of claim 1, further comprising:
a memory controller coupled to the first and second three-dimensional memory packages and configured to provide the first clock enable signal and the first plurality of chip select signals to the first three-dimensional memory package and provide the second clock enable signal and the second plurality of chip select signals to the second three-dimensional memory package.

3. The memory module of claim 2, further comprising:
a signal presence detect unit configured to provide configuration data to the memory controller, wherein the configuration data is associated with a quad die package.

4. The memory module of claim 1, wherein individual ones of the at least two stacked memory dies of the first three-dimensional memory package are configured to receive the first clock enable signal and individual ones of the at least two stacked memory dies of the second three-dimensional memory package are configured to receive the second clock enable signal.

5. The memory module of claim 1, wherein each of the non-consecutive memory ranks of the at least two stacked dies of the first three-dimensional memory package and each of the non-consecutive memory ranks of the at least two stacked dies of the second three-dimensional memory package correspond to a respective rank of a memory package having at least four ranks, wherein, within the memory package having at least four ranks, at least one rank of the first three-dimensional memory package is consecutive with at least one rank of the second three-dimensional memory package.

6. The memory module of claim 5, wherein a first memory die and a second memory die of the at least two stacked memory dies of the first three-dimensional memory package are coupled together and external signals for the second memory die are coupled through the first memory die, wherein the at least two stacked memory dies of the first three-dimensional memory package are each identified with a different memory rank.

7. The memory module of claim 6, wherein the at least two stacked memory dies of the second three-dimensional memory package are each identified with a different memory rank.

8. An apparatus comprising:
a first three-dimensional memory package including a first memory die stacked on a second memory die, wherein the first memory die is identified with a first memory rank and the second memory die is identified with a second memory rank, wherein the first three-dimensional memory package is configured to receive a first clock enable signal, a first chip select signal, and a second chip select signal;
a second three-dimensional memory package including a third memory die stacked on a fourth memory die, wherein the third memory die is identified with a third memory rank and the fourth memory die is identified with a fourth memory rank, wherein the second three-dimensional memory package is configured to receive a second clock enable signal, a third chip select signal, and a fourth chip select signal; and
wherein the third memory rank assigned to the third memory die of the second three-dimensional memory package has a value that falls sequentially between a value of the first memory rank assigned to the first memory die of the first three-dimensional memory package and a value of the second memory rank assigned to the second memory die of the first three-dimensional memory package.

9. The apparatus of claim 8, wherein the second memory rank assigned to the second memory die of the first three-dimensional memory package has a value that falls sequentially between the value of the third memory rank assigned to the third memory die of the second three-dimensional memory package and a value of the fourth memory rank assigned to the fourth memory die of the second three-dimensional memory package.

10. The apparatus of claim 8, further comprising a signal presence detect unit configured to provide configuration data to a memory controller, wherein the configuration data includes control signal timings for accessing the first and second memory dies of the first three-dimensional memory package and the third and fourth memory dies of the second three-dimensional memory package.

11. The apparatus of claim 10, wherein the control signal timings provided from the signal presence detection unit to the memory controller include timing relationships between clock enable signals received at the first and second three-dimensional memory packages, the first, second, third, and fourth chip select signals, and on-die termination signals received at the first and second three-dimensional memory packages.

12. The apparatus of claim 10, wherein the signal presence detect unit is configured to provide the configuration data to the memory controller in response to receipt of a configuration signal.

13. The apparatus of claim 10, wherein the signal presence detect unit is configured to provide the configuration data to the memory controller during initialization.

14. The apparatus of claim 10, wherein the configuration data further includes data corresponding to input/output (I/O) pin assignments for the first clock enable signal, the first chip select signal, and the second chip select signal of the first three-dimensional memory package and I/O pin assignments for the second clock enable signal, the third chip select signal, and the fourth chip select signal of the second three-dimensional memory package.

15. A method comprising:
receiving a first clock enable signal and a first chip select signal at a first memory die of a first three-dimensional memory package of a memory module, wherein the first chip select signal has a value indicating selection of the first memory die for a first memory access operation, wherein the first memory die is identified with a first memory rank;
receiving a second clock enable signal and a second chip select signal at a second memory die of a second three-dimensional memory package of the memory module, wherein the second chip select signal has a value indicating selection of the second memory die for a second memory access operation, wherein the second memory die is identified with a second memory rank;
receiving the first clock enable signal and a third chip select signal at a third memory die of the first three-dimensional memory package, wherein the third chip select signal has a value indicating selection of the third memory die for a third memory access operation, wherein the third memory die is identified with a third memory rank; and
receiving the second clock enable signal and a fourth chip select signal at a fourth memory die of the second three-dimensional memory package, wherein the fourth chip select signal has a value indicating selection of the fourth memory die for a fourth memory access operation, wherein the fourth memory die is identified with a fourth memory rank, wherein the second memory rank assigned to the second memory die of the second three-dimensional memory package has a value that falls sequentially between a value of the first memory rank assigned to the first memory die of the first three-dimensional memory package and a value of the third memory rank assigned to the third memory die of the first three-dimensional memory package.

16. The method of claim 15, further comprising providing configuration data to a memory controller from a signal presence detect unit of the memory module, wherein the configuration data includes data corresponding to input/output (I/O) pin assignments for the first clock enable signal, the first chip select signal, and the third chip select signal of the first three-dimensional memory package and I/O pin assignments for the second clock enable signal, the second chip select signal, and the fourth chip select signal of the second three-dimensional memory package.

17. The method of claim 15, further comprising providing configuration data to a memory controller from a signal presence detect unit of the memory module, wherein the configuration data includes control signal timings for accessing the first and third memory dies of the first three-dimensional memory package and the second and fourth memory dies of the second three-dimensional memory package.

18. The method of claim 17, wherein providing the configuration data to the memory controller includes providing timing relationships between clock enable signals received at the first and second three-dimensional memory packages, the first, second, third, and fourth chip select signals, and on-die termination signals received at the first and second three-dimensional memory packages.

19. The method of claim 17, further comprising receiving a configuration signal, wherein provision of the configuration data to the memory controller is in response to receipt of the configuration signal.

20. The method of claim 15, wherein the third memory die is stacked on the first memory die within the first three-dimensional memory package and the second memory die is stacked on the fourth memory die within the second three-dimensional memory package.

* * * * *